United States Patent
Chu-Kung et al.

(10) Patent No.: US 8,872,225 B2
(45) Date of Patent: Oct. 28, 2014

(54) DEFECT TRANSFERRED AND LATTICE MISMATCHED EPITAXIAL FILM

(71) Applicant: Intel Corporation, Santa Clara, CA (US)

(72) Inventors: Benjamin Chu-Kung, Hillsboro, OR (US); Van Le, Beaverton, OR (US); Robert Chau, Portland, OR (US); Sansaptak Dasgupta, Hillsboro, OR (US); Gilbert Dewey, Hillsboro, OR (US); Niti Goel, Austin, TX (US); Jack Kavalieros, Portland, OR (US); Matthew Metz, Portland, OR (US); Niloy Mukherjee, Beaverton, OR (US); Ravi Pillarisetty, Portland, OR (US); Willy Rachmady, Beaverton, OR (US); Marko Radosavljevic, Beaverton, OR (US); Han Wui Then, Portland, OR (US); Nancy Zelick, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/722,824

(22) Filed: Dec. 20, 2012

(65) Prior Publication Data

US 2014/0175512 A1    Jun. 26, 2014

(51) Int. Cl.
  *H01L 21/02*    (2006.01)
  *H01L 29/78*    (2006.01)
(52) U.S. Cl.
  CPC .................................. *H01L 29/7842* (2013.01)
  USPC ..... 257/190; 257/353; 257/354; 257/E29.299

(58) Field of Classification Search
  USPC .......................... 257/190, 353, 354, E29.299
  See application file for complete search history.

(56) References Cited

U.S. PATENT DOCUMENTS

| | | | |
|---|---|---|---|
| 6,803,631 B2 | 10/2004 | Dakshina-Murthy et al. | |
| 7,494,911 B2 | 2/2009 | Hudait | |
| 7,785,958 B2 | 8/2010 | Doczy et al. | |
| 7,851,865 B2 * | 12/2010 | Anderson et al. ............. | 257/365 |
| 8,518,781 B2 * | 8/2013 | Fumitake ....................... | 438/282 |
| 8,658,520 B2 * | 2/2014 | Aoyama et al. ............... | 438/482 |
| 2001/0038130 A1 | 11/2001 | Kim | |

(Continued)

OTHER PUBLICATIONS

Bohr, Mark, "Intel's Revolutionary 22 nm Transistor Technology", May 2011, 1-28.

(Continued)

*Primary Examiner* — Tu-Tu Ho
(74) *Attorney, Agent, or Firm* — Trop, Pruner & Hu, P.C.

(57) ABSTRACT

An embodiment uses a very thin layer nanostructure (e.g., a Si or SiGe fin) as a template to grow a crystalline, non-lattice matched, epitaxial (EPI) layer. In one embodiment the volume ratio between the nanostructure and EPI layer is such that the EPI layer is thicker than the nanostructure. In some embodiments a very thin bridge layer is included between the nanostructure and EPI. An embodiment includes a CMOS device where EPI layers covering fins (or that once covered fins) are oppositely polarized from one another. An embodiment includes a CMOS device where an EPI layer covering a fin (or that once covered a fin) is oppositely polarized from a bridge layer covering a fin (or that once covered a fin). Thus, various embodiments are disclosed from transferring defects from an EPI layer to a nanostructure (that is left present or removed). Other embodiments are described herein.

25 Claims, 14 Drawing Sheets

(56) References Cited

U.S. PATENT DOCUMENTS

| | | | |
|---|---|---|---|
| 2003/0012984 A1* | 1/2003 | Ueda | 428/698 |
| 2004/0012015 A1* | 1/2004 | Saxler | 257/18 |
| 2004/0256639 A1* | 12/2004 | Ouyang et al. | 257/202 |
| 2009/0085027 A1 | 4/2009 | Jin et al. | |
| 2009/0101978 A1* | 4/2009 | Anderson et al. | 257/365 |
| 2012/0187482 A1 | 7/2012 | Adam et al. | |
| 2013/0023102 A1* | 1/2013 | Aoyama et al. | 438/301 |
| 2013/0134488 A1* | 5/2013 | Fumitake | 257/288 |
| 2013/0234204 A1* | 9/2013 | Kang et al. | 257/190 |

OTHER PUBLICATIONS

Lochtefeld, Anthony, "Defect Reduction for Lattice Mismatched Epitaxy Via Aspect Ratio Trapping", Solid State Technology, Aug. 1, 2008, 5 pages.

Raychaudhuri, S., "Calculation of Critical Dimensions for Wurtzite and Cubic Zinc Blende Coaxial Nanowire Heterostructures", Jul./Aug. 2006, 2053-5059, B 24(4), AVS: Science & Technology of Materials, Interfaces, and Processing.

Kavanagh, Karen L., "Misfit Dislocations in Nanowire Heterostructures" Jan. 22, 2010, 1-7, Semicond. Sci. Technol. 25, IOP Publishing.

Xue, Zhongying, "Epitaxial Growth of Fully Relaxed Si0.75Ge0.25 on SOI Substrate" 2011, 5021-5024, Applied Surface Science 257.

Rehder, E. M., "SiGe Relaxation on Silicon-On-Insulator Substrates: An Experimental and Modeling Study", Dec. 15, 2003, 7892-7903, Journal of Applied Physics, vol. 94, No. 12.

Esfandyarpour, Rahim, "Tunneling Field Effect Transistors", Jun. 12, 2012, 6 pages.

Patent Cooperation Treaty, Notification of Transmittal of the International Search Report and the Written Opinion of the International Searching Authority mailed Oct. 28, 2013, for international application No. PCT/US2013/048025.

* cited by examiner

DEFECT TRANSFERRED AND LATTICE MISMATCHED EPITAXIAL FILM

BACKGROUND

A variety of electronic and optoelectronic devices can be enabled by developing, for example, high quality III-V semiconductors on elemental silicon (Si) substrates or IV semiconductors on Si substrates. Surface layers capable of achieving the performance advantages of III-V or IV materials may host a variety of high performance electronic devices such as CMOS and quantum well (QW) transistors fabricated from extremely high mobility materials such as, but not limited to, indium antimonide (InSb), indium arsenide (InAs), germanium (Ge), and silicon germanium (SiGe). Optical devices such as lasers, detectors and photovoltaics may also be fabricated from various other direct band gap materials, such as, but not limited to, gallium arsenide (GaAs) and indium gallium arsenide (InGaAs). These devices can be further enhanced by monolithically integrating them with conventional devices of Si since use of a Si substrate has the additional advantage of cost reduction.

The growth of III-V and IV materials upon Si substrates, however, presents many challenges. Crystal defects are generated by lattice mismatch, polar-on-nonpolar mismatch, and thermal mismatch between the III-V semiconductor epitaxial (EPI) layer and the Si semiconductor substrate or the IV semiconductor EPI layer and the Si semiconductor substrate. When the lattice mismatch between the EPI layer and substrate exceeds a few percent, the strain induced by the mismatch becomes too large and defects are generated in the EPI layer by relaxing the EPI film. Once the film thickness is greater than the critical thickness (i.e., film is fully strained below this thickness and partially relaxed above this thickness), the strain is relaxed by creating misfit dislocations at the film and substrate interface as well as in the EPI film. The EPI crystal defects may be in the form of threading dislocations, stacking faults and twins. Many defects, particularly threading dislocations and twins, tend to propagate into the "device layer" where the semiconductor device is fabricated. Generally, the severity of defect generation correlates to the amount of lattice mismatch between the III-V semiconductor and the Si substrate or the IV semiconductor and the Si substrate.

BRIEF DESCRIPTION OF THE DRAWINGS

Features and advantages of embodiments of the present invention will become apparent from the appended claims, the following detailed description of one or more example embodiments, and the corresponding figures, in which:

DETAILED DESCRIPTION

Figure 1A:
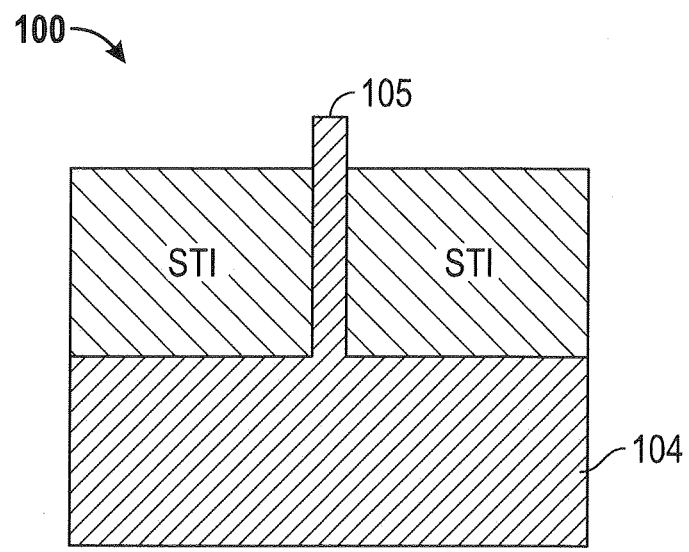
FIGS. 1(a)-(f) include an embodiment of the invention comprising a bridge layer and another embodiment where the bridge layer has been removed.
Figure 1B:
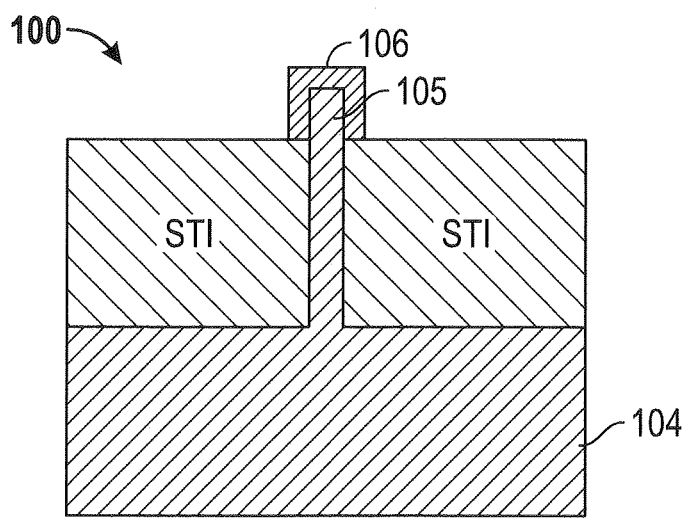
Figure 1C:
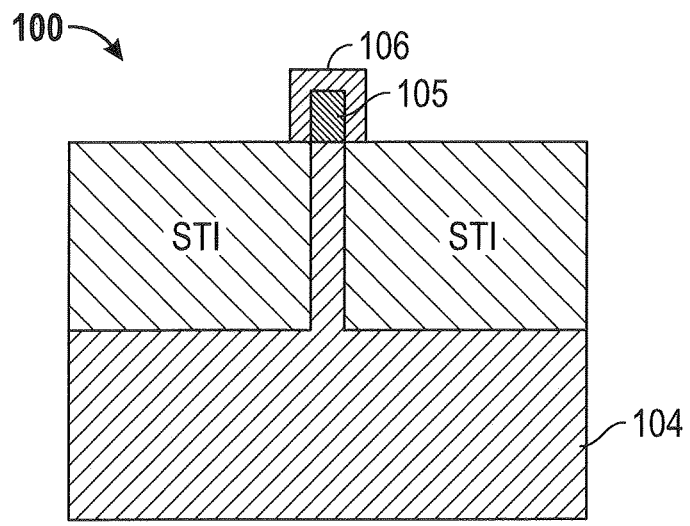
Figure 1D:
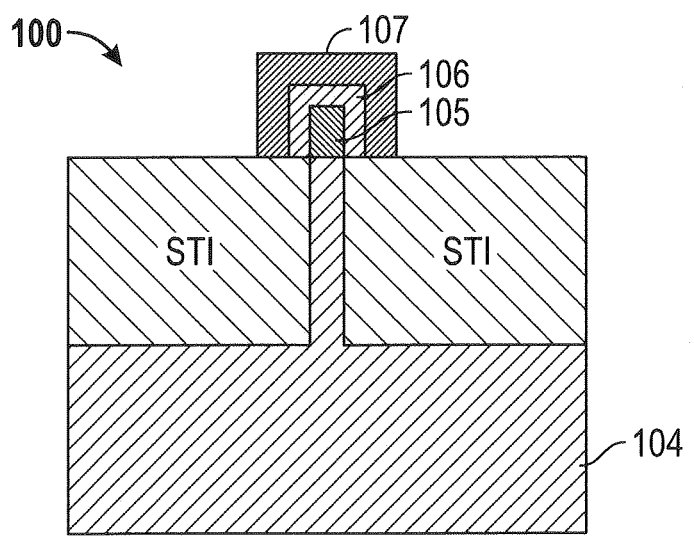

In the following description, numerous specific details are set forth but embodiments of the invention may be practiced without these specific details. Well known circuits, structures and techniques have not been shown in detail to avoid obscuring an understanding of this description. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

A conventional technique for lattice mismatched configurations involves deposition of thick buffers (e.g., that are 0.5 or more microns thick) that bridge the lattice constant difference between the substrate and the layers of interest (device layers including III-V materials and the like). In such conventional techniques complicated anneals and compositional grading processes are used to "bend" the defects into each other within the thick buffer so the defects annihilate. Many thick buffer techniques are time consuming, expensive, include undesirable surface roughness of the buffer, and the minimum defect density still remains high.

Another conventional technique includes Aspect Ratio Trapping (ART). ART is based on threading dislocations that propagate upwards at a specific angle. In ART a trench is made with a high enough aspect ratio such that the defects terminate on the sidewall of the trench and any layer above the terminations is defect free.

An embodiment differs from the conventional methods described above. For example, an embodiment uses a very thin layer nanostructure (e.g., a Si or SiGe nanostructure) as a template to grow a crystalline, non-lattice matched, EPI layer. The volume ratio between the nanostructure/EPI layers is the opposite of more conventional methods of including, for example, a thick substrate with a thin planar EPI layer. This may transfer strain, and possibly defects, from the EPI layer (often seen with conventional methods) to the underlying nanostructure. In other words, in some embodiments (but not all embodiments) the EPI layer is thicker than the underlying structure (e.g., fin).

One embodiment may include silicon on insulator (SOI) where the silicon over the insulator is very thin in relation to the EPI layer. However, in another embodiment no SOI is used. Instead (or in addition to SOI), an embodiment compatible with modern manufacturing processes utilizes a generally "vertical" fin that reaches towards the horizontal substrate (i.e., has a long axis orthogonal to horizontal substrate). In addition to ease of manufacturing, the fin based embodiment also allows for EPI deposition on both sides of the fin. The growth on both sides of the fin allows half the EPI to grow on each side of the fin to collectively (between EPI grown on multiple fin walls) achieve a higher volumetric advantage (i.e., high volume of EPI to lower volume of fin material).

Figure 5:
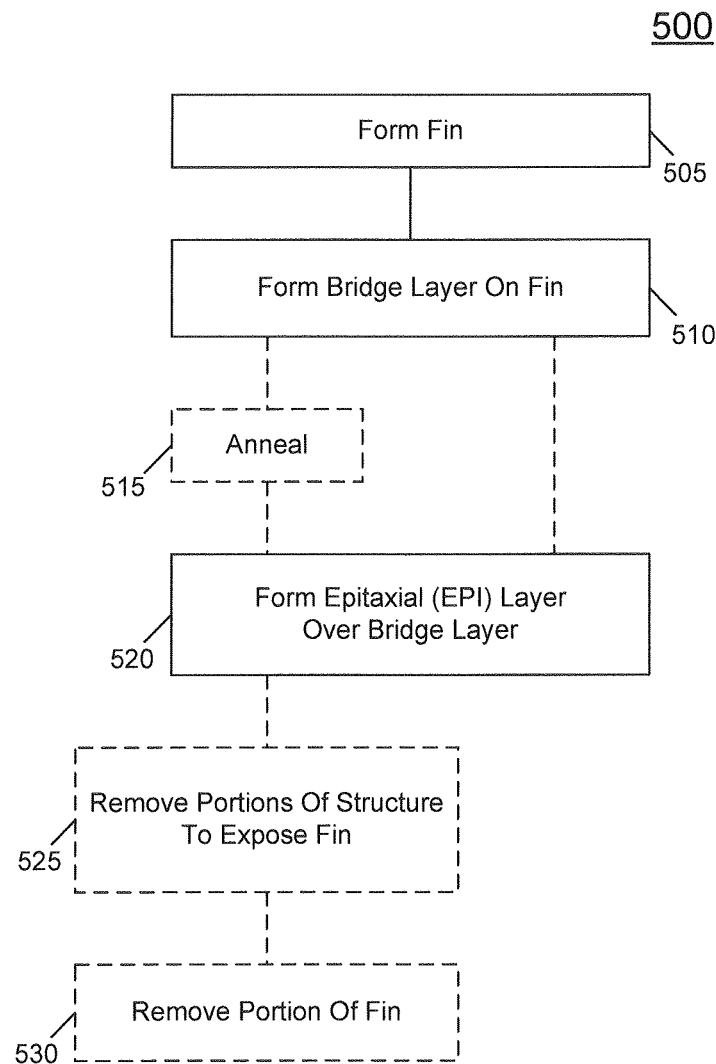
FIG. 5 includes a method in an embodiment of the invention.

FIGS. 1(a)-(f) include an embodiment of the invention comprising a bridge layer (as well as optional embodiments where a bridge layer is removed). FIG. 5 includes a method in an embodiment of the invention. FIGS. 1(a)-(f) and 5 are discussed below.

In block 505 fin 105 is formed (FIG. 1(a)). Fin 105 couples, directly or indirectly, to substrate 104. In one embodiment fin 105 may be adjacent shallow trench isolation (STI) portions but such insulation portions are not included in other embodiments. In block 510 bridge layer 106 is formed over fin 105 (FIG. 1(b)). This optional step may be desirable when an EPI layer (e.g., III-V or IV material) cannot be grown directly on fin 105 (e.g., Si or SiGe fin). Bridge layer 106 may change the lattice constant of fin 105 by, for example, driving defects into the fin. A bridge layer differs from thick buffer layers due to, for example, the thickness of the bridge layer (e.g., less than 30-40 nm) versus a conventional buffer (e.g., greater than 0.5 microns). As an option, in one embodiment in block 515 (shown in dash to indicate its optional nature) fin 105 and bridge layer 106 are annealed to close or remove any lattice mismatch between fin 105 and bridge layer 106 (FIG. 1(c)). In block 520 (FIG. 1(d)) EPI layer 107 is formed over bridge layer 106 (or directly over fin 105 if no bridge layer is used). EPI layer 107 may serve as channel material including, for example, a IV or III-V material such as Ge, SiGe, GaAs, AlGaAs, InGaAs, InAs, and InSb.

Figure 2A:
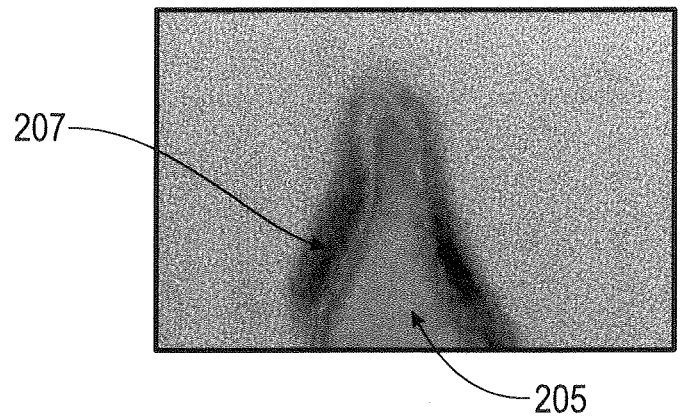
FIGS. 2(a)-(b) include figures based on transmission electron microscope (TEM) images of fin based (EPI) layer embodiments of the invention.
Figure 2B:
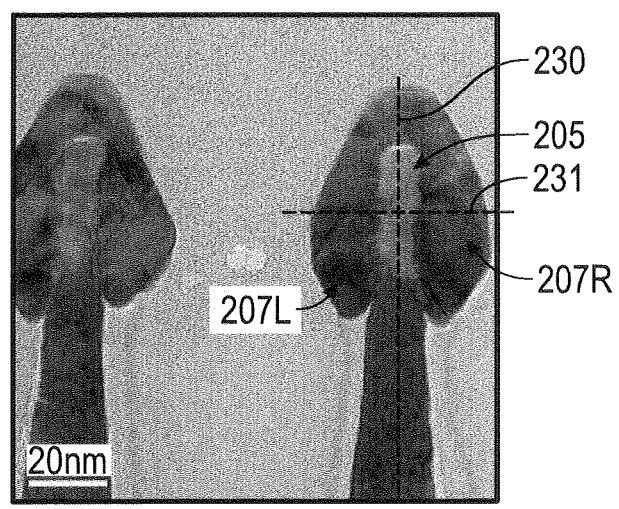
Figure 3A:
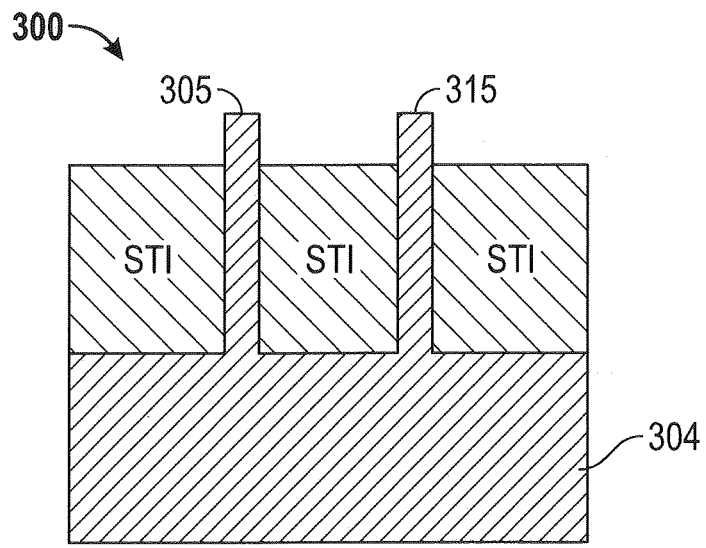
FIGS. 3(a)-(g) include a complementary metal-oxide-semiconductor (CMOS) apparatus in an embodiment of the invention.
Figure 3B:
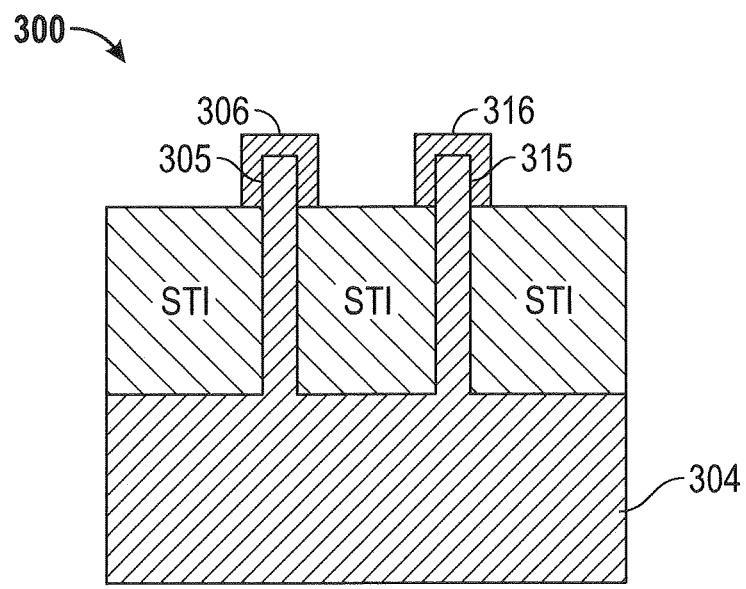
Figure 3C:
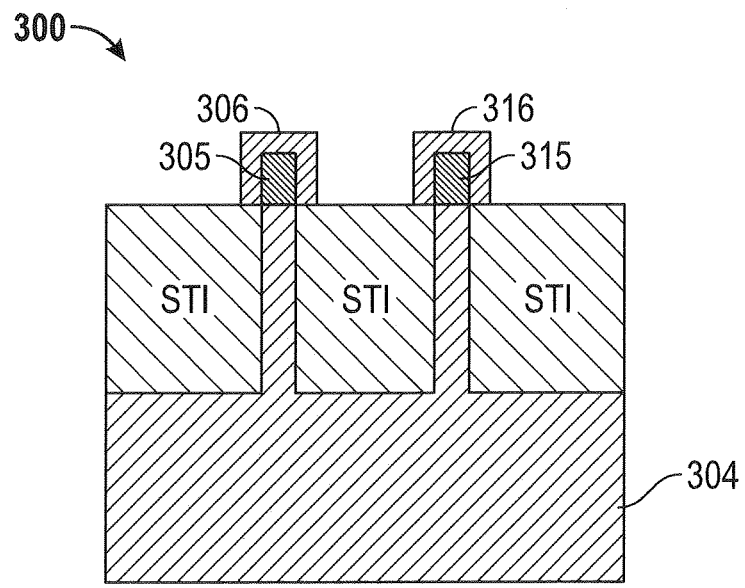
Figure 3D:
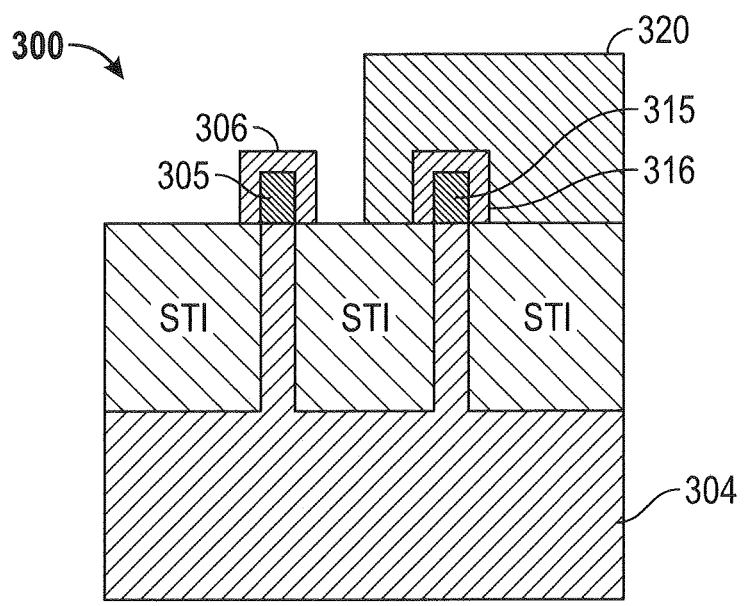
Figure 3E:
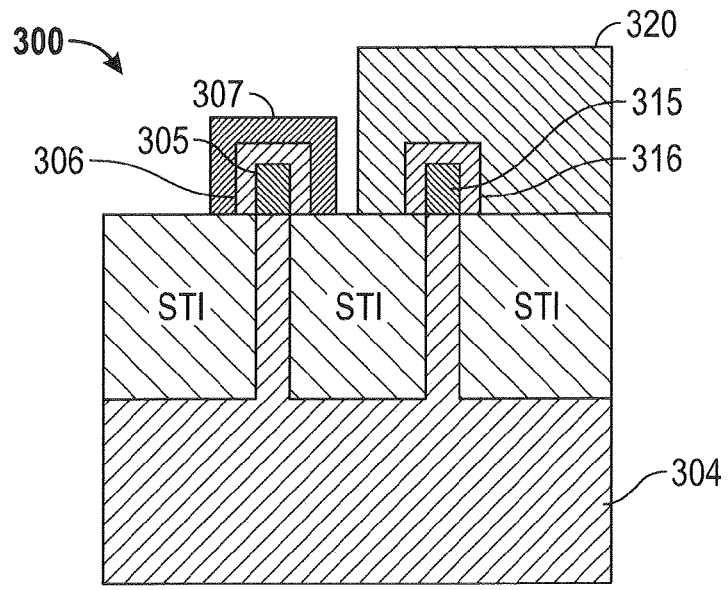
Figure 3F:
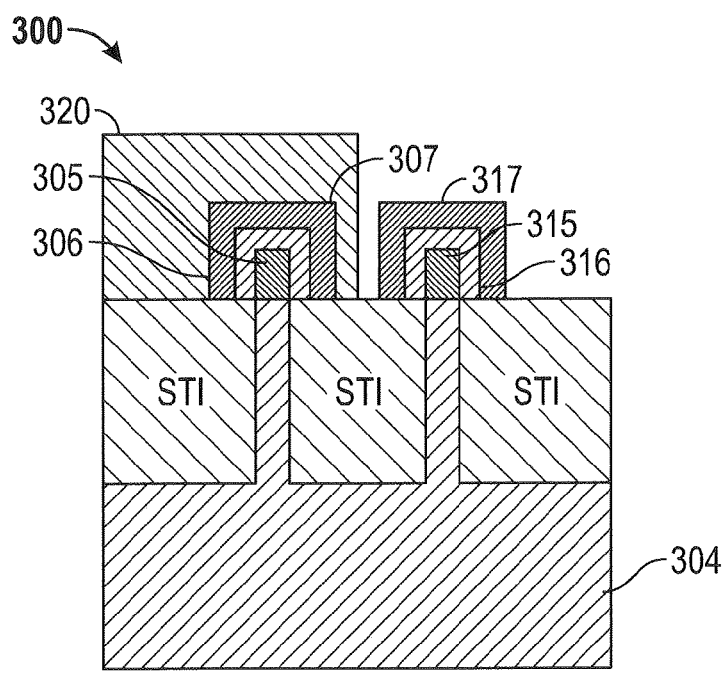
Figure 3G:
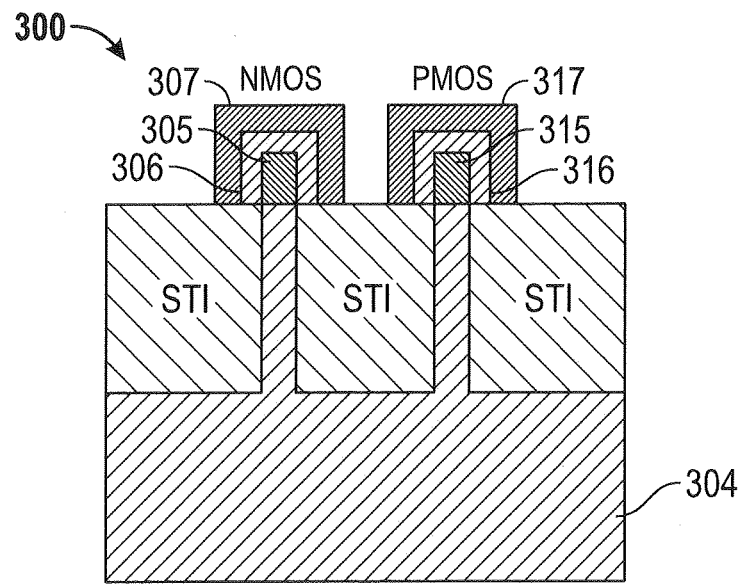

FIGS. 2(a)-(b) include figures based on transmission electron microscope (TEM) images of fin based (EPI) layer embodiments of the invention. FIG. 2(a) includes InAs EPI film 207 on Si fin 205 with an 11% lattice mismatch between the two. EPI 207 is nearly defect free. No bridge layer is present in FIG. 2(a).

FIG. 2(b) includes a Ge EPI layer 207 (left portion denoted 207L and right portion denoted 207R, collectively referred to as element 207) on Si fin 205. EPI 207 may not be entirely defect free but includes significantly fewer defects than is the case when Ge is grown directly on planar Si. The Si fin is strained near its top at its interface with Ge EPI 207. No bridge layer is present in FIG. 2(b). In both FIGS. 2(a) and (b) fin 205 is so small the EPI layer 207 is larger (or similar in width) than the fin (or portions of the fin) and the Si fin is strained. In FIG. 2(b) the "left" EPI wall 207(L) and the "right" EPI wall 207(R) are divided by the fin long axis/vertical axis 230. Horizontal plane 231 is orthogonal to axis 230 and intersects fin 205 and sidewalls of 207(L) and 207(R). The surface area of fin 205 along plane 231 is less than the collective total surface area of walls 207(L) and 207(R) along the same plane. However, in other embodiments this is not necessarily the case (e.g., FIG. 2(a) shows the EPI layer much thinner in relation to the fin). In some embodiments a higher volumetric ratio of EPI/fin may drive defects and strain from the EPI layer into the fin.

At this point, the wafers can be sent through conventional processing techniques to form, for example, transistors. However, in other embodiments the fin may be removed. If the fin is strained and starting to form defects the defects may form a leakage path that will degrade device performance. Such a fin may be removed to lessen the leakage current. Also, regardless of the defect quality of the silicon, leaving the fin in may worsen electrostatics and thus a fin may be removed where electrostatics are a concern.

Figure 1E:
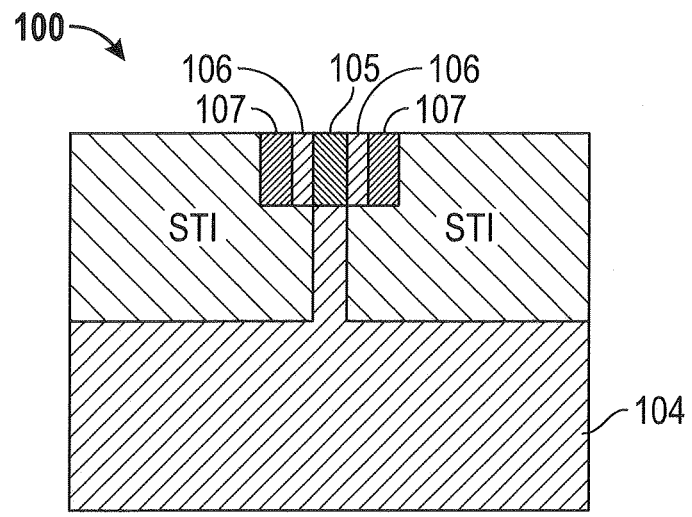
Figure 1F:
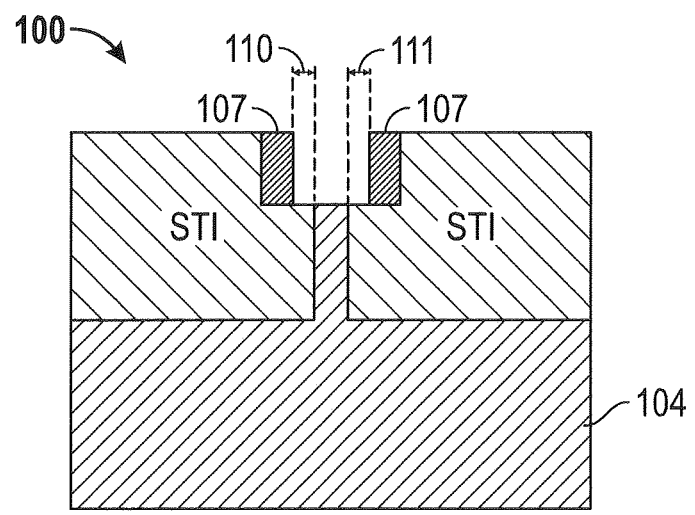

Regarding fin removal, in FIG. 5 block 525 STI can be deposited to a height of the top of the fin or higher and then polished down through the top of fin 105 (FIG. 1(e)). This exposes fin 105 and bridge layer 106 so portions of the fin and/or bridging layer can be removed via, for example, wet etch (block 530). This will leave 2 epitaxial portions 107 on the STI in the embodiment of FIG. 1(f). The remaining portions may be equidistant from the trench that previously included the fin. In other words, distance 110 may generally equal distance 111. Processing may then resume.

Figure 6:
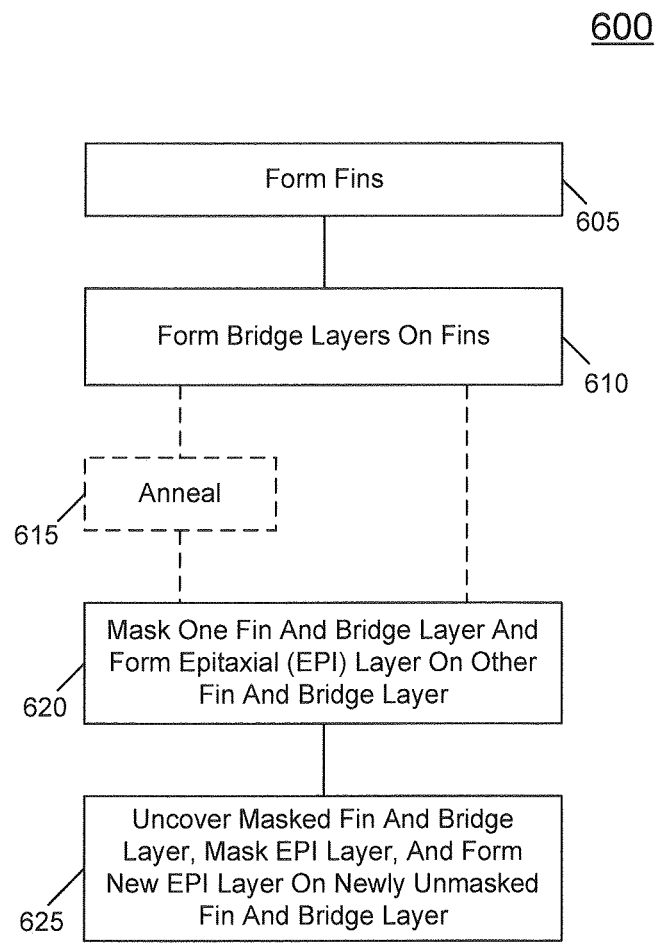
FIG. 6 includes a CMOS related method in an embodiment of the invention.

FIGS. 3(a)-(g) include a CMOS apparatus in an embodiment of the invention. FIG. 6 includes a CMOS related method in an embodiment of the invention. FIGS. 3(a)-(g) and FIG. 6 are discussed below.

An embodiment includes a CMOS apparatus. For example, where there is an EPI deposition step, an oxide hardmask can be deposited and used to determine which polarity EPI is deposited. In block 605 fins 305, 315 are formed (FIG. 3(a)). Fins 305, 315 couple, directly or indirectly, to substrate 304. In one embodiment fins 305, 315 may be adjacent STI portions but such insulation portions are not included in other embodiments. In block 610 bridge layers 306, 316 are formed over fins 305, 315 (FIG. 3(b)). This optional step may be desirable when an EPI layer (e.g., III-V or IV material) cannot be grown directly on fins 305, 315 (e.g., Si or SiGe fin). Bridge layers 306, 316 may change the lattice constant of fins 305, 315 by, for example, driving defects into the fins. As an option, in one embodiment in block 615 (shown in dash to indicate its optional nature) fins 305, 315 and bridge layers 306, 316 are annealed to lessen or remove any lattice mismatch between the fins and bridge layers (FIG. 3(c)). In block 620 oxide is deposited on layers 306, 316 and then a lithography step is performed to pattern photoresist. The photoresist is used to remove the oxide from layer 306 to produce the embodiment of FIG. 3(d) with oxide 320 over layer 316. EPI 307 can be formed (FIG. 3(e)) and then in block 625 the hard mask is removed and the process is repeated for fin 305, bridge layer 306, EPI 307 so EPI 317 may be formed (FIG. 3(f)). EPI 307 may be of opposite polarity to EPI 317 to generate a CMOS device (FIG. 3(g)).

Figure 7:
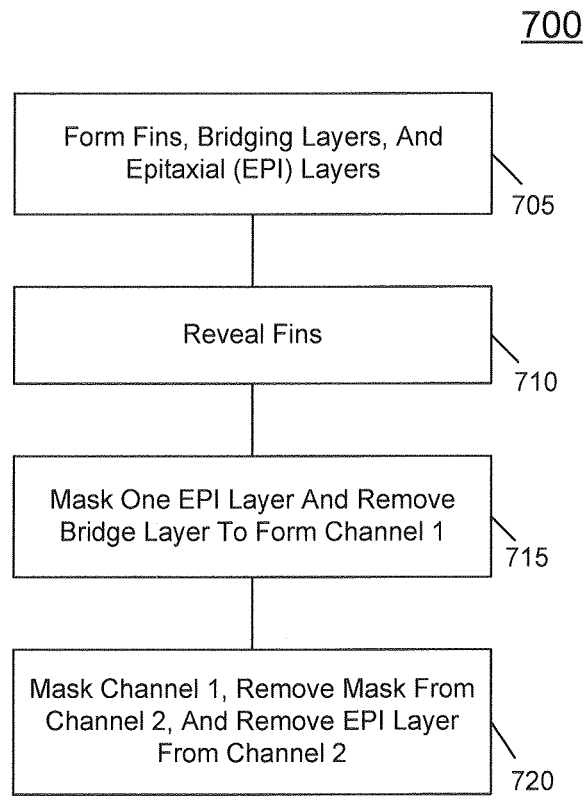
FIG. 7 includes a CMOS related method in an embodiment of the invention.

FIGS. 4(a)-(g) include a CMOS apparatus in an embodiment of the invention. FIG. 7 includes a CMOS related method in an embodiment of the invention. FIGS. 4(a)-(g) and FIG. 7 are discussed below.

Figure 4A:
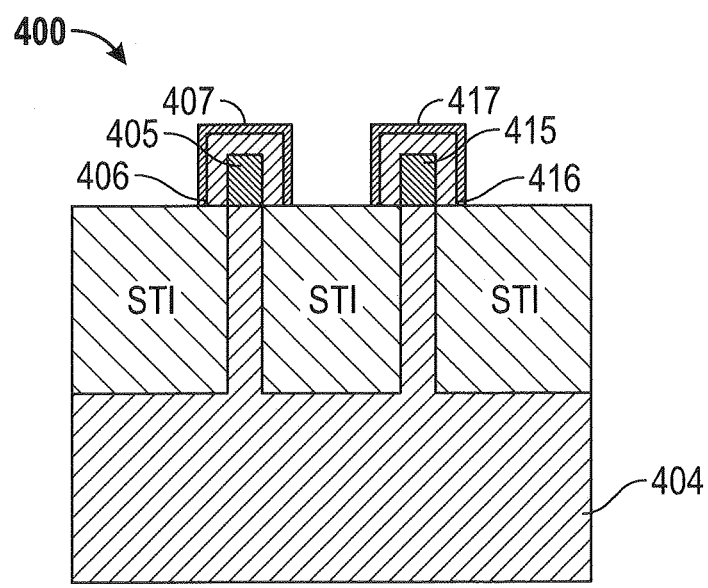
FIGS. 4(a)-(g) include a CMOS apparatus in an embodiment of the invention.
Figure 4B:
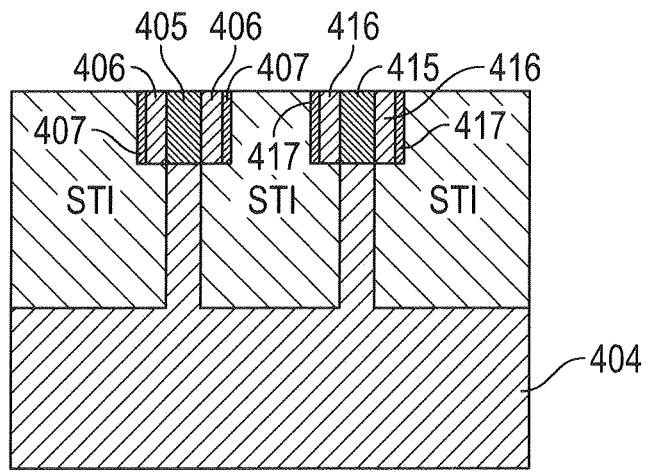
Figure 4C:
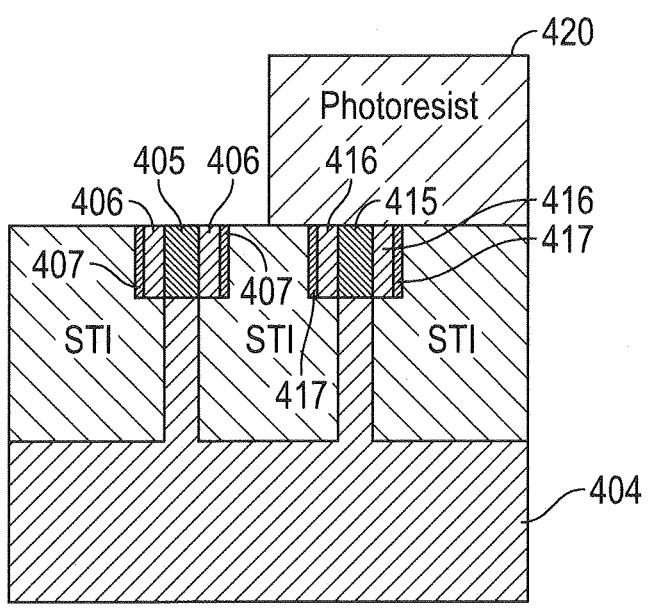
Figure 4D:
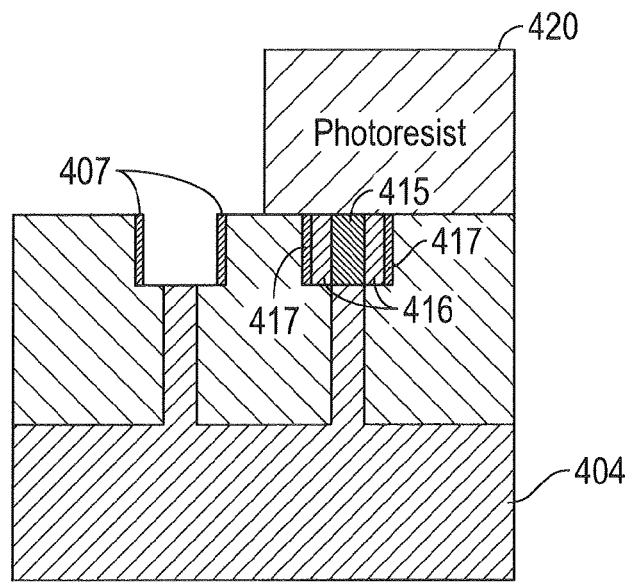
Figure 4E:
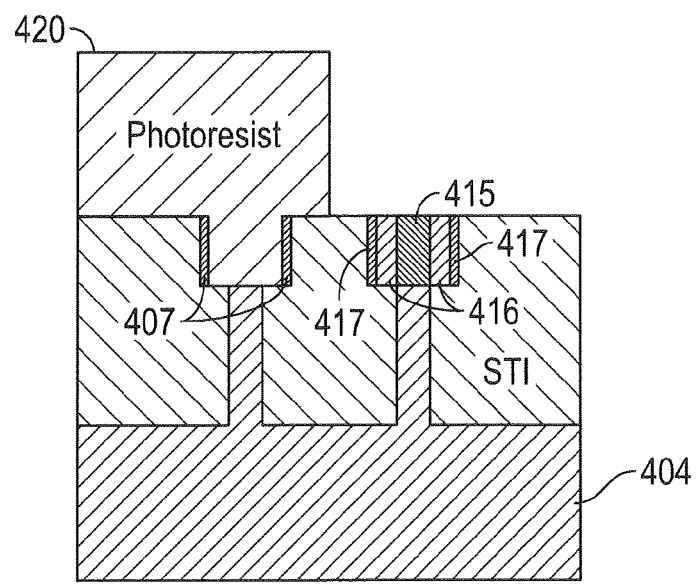
Figure 4F:
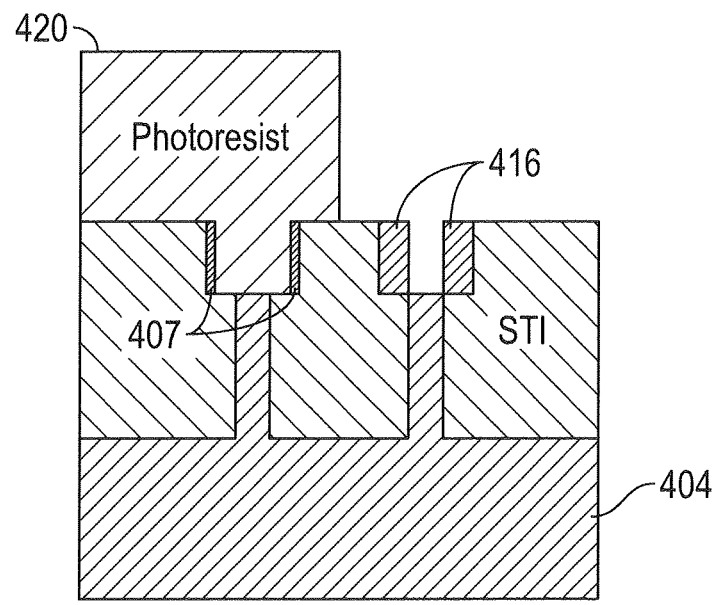

In this embodiment instead of depositing two EPI layers of differing polarity to construct a CMOS device (e.g., FIGS. 3(a)-(g)), a bridging layer is used as the opposite polarity/channel of another oppositely doped bridge layer or EPI layer. In block 705 fins 405, 415, bridge layers 406, 416, and EPI layers 407, 417 are provided (FIG. 4(a)) and may formed as described above. In block 710 STI may be added to reach fin height or above and then fins 405, 415 are revealed (e.g., via etching) as shown in FIG. 4(b). In block 715 the process deposits mask 420 (e.g., photoresist may be used in one embodiment but other embodiments are not so limited and may include oxide and the like) over fin 415/bridge layer 416/EPI layer 417 (FIG. 4(c)) to etch out bridge layer 406 and fin 405 (FIG. 4(d)) leaving EPI 407, which may serve as a first channel material ("channel1") that may be doped. In block 720 mask 420 is located over EPI 407 (channel1, as shown in FIG. 4(d)) and EPI 417 and Si 415 are etched out (FIG. 4(f) with oxide, insulator, and/or metal and the like replacing former area occupied by EPI 417) to reveal a CMOS device (FIG. 4(g)) where EPI 407 (channel1) is of opposite polarity to bridge layer 416 ("channel2"). In this embodiment the bridging layer is the channel material for one device and an EPI layer is the channel material for another device. In an embodiment two oppositely doped bridge layers could be used to form a CMOS device. In an embodiment two oppositely doped EPI layers could be used to form a CMOS device.

Figure 4G:
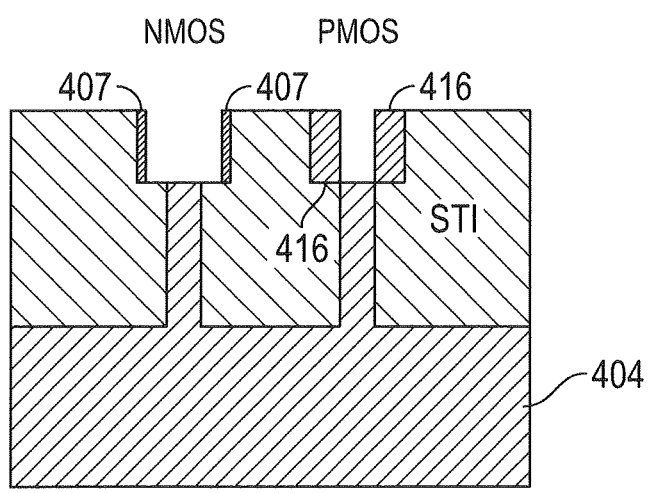

In an embodiment, the doped channel may couple to a source (e.g., not shown but in the foreground of FIG. 4(g) located on or in another portion of fin 405) and a drain (e.g., not shown but in the background of FIG. 4(g) located on or in another portion of fin 405).

Thus, various embodiments are described above. For example, in one embodiment the fin is left intact so that EPI is on top of the fin and the fin is strained. In the case where the fin is etched out there may still be remaining fin portions for the source/drain regions. In another embodiment, EPI and/or bridge layer side walls may be located equidistant from the fin or where the fin used to be. In various embodiments defects are significantly reduced as compared to forming EPI over a planar substrate or a thick fin.

An embodiment includes an apparatus comprising: a fin structure including a fin top and opposing fin sidewall portions extending from the fin top towards a substrate; a bridge layer including opposing bridge layer sidewall portions respectively directly contacting the opposing fin sidewall portions; and an EPI layer comprising opposing EPI sidewall portions respectively directly contacting the opposing bridge layer sidewall portions; wherein a lattice constant mismatch between the bridge layer and fin structure is less than a lattice constant mismatch between the bridge layer and EPI layer. In some embodiments the fin reaches the substrate but not so in other embodiments. In some embodiments no bridge layer is used. In some embodiments the lattice constants for the EPI layer, bridge layer, and fin are all the same due to annealing or without annealing. However, in other embodiments the lattice constants for each/some of the EPI layer, bridge layer, and fin are different.

In an embodiment the EPI layer comprises an EPI material including one of a IV and a III-V material, the fin structure includes a fin structure material including silicon (e.g., SiGe), and the bridge layer includes a bridge layer material unequal to either of the fin structure material and the EPI material. For example, the fin may include $Si_xGe_{1-x}$, and the bridge layer may include $Si_yGe_{1-y}$ where x is unequal to y.

An embodiment includes an apparatus comprising: a fin structure including a fin top and opposing fin sidewall portions extending from the fin top towards a substrate; a bridge layer including opposing bridge layer sidewall portions respectively directly contacting the opposing fin sidewall portions; and an epitaxial (EPI) layer comprising opposing EPI sidewall portions respectively directly contacting the opposing bridge layer sidewall portions; wherein a lattice constant differential between the bridge layer and fin structure is less than a lattice constant differential between the bridge layer and the EPI layer. In an embodiment the EPI layer comprises an EPI material including one of a group IV material and a group III-V material, the fin structure includes a fin structure material including silicon, and the bridge layer includes a bridge layer material unequal to either of the fin structure material and the EPI material. In an embodiment the EPI layer is included in a channel of a transistor and couples to a source and a drain of the transistor. In an embodiment the substrate does not include a silicon on insulator (SOI) configuration. In an embodiment the EPI layer is included in a channel of a transistor and couples to a source and a drain of the transistor, the source and drain both directly contacting the fin structure. In an embodiment the fin includes a concentration of strain adjacent the fin top. In an embodiment the EPI layer lacks defects along the entire border between the EPI layer and the bridge layer. In an embodiment a single plane, orthogonal to a long vertical axis of the fin, intersects the fin over a first area and the EPI sidewalls over a second area and the second area is greater than the first area. In an embodiment the fin is monolithic with the substrate and the EPI layer sidewall portions are monolithic with one another. An embodiment comprises: an additional fin structure, adjacent the fin structure, including the first lattice constant and opposing additional fin sidewall portions extending from the fin top to a substrate; and an additional bridge layer including the first lattice constant and opposing additional bridge layer sidewall portions respectively directly contacting the opposing additional fin sidewall portions; wherein the EPI layer has a first polarity, the additional bridge layer has second polarity opposite the first polarity, and the EPI layer and the additional bridge layer are included in a CMOS device. An embodiment comprises: an additional fin structure, adjacent the fin structure, including the first lattice constant and opposing additional fin sidewall portions extending from the fin top to a substrate; an additional bridge layer including the first lattice constant and opposing additional bridge layer sidewall portions respectively directly contacting the opposing additional fin sidewall portions; and an additional EPI layer, including the second lattice constant and opposing additional EPI sidewall portions respectively directly contacting the opposing additional bridge layer sidewall portions; wherein the EPI layer has a first polarity, the additional EPI layer has second polarity opposite the first polarity, and the EPI layer and the additional EPI layer are included in a CMOS device. In an embodiment the bridge sidewall layers are equidistant from the fin structure.

An embodiment comprises: an interlayer dielectric including a first trench and a second trench proximate the first trench; at least one semiconductor channel including a first layer formed along a sidewall of the first trench, the first layer including one of a group III-V material layer and a group IV material layer; and at least one semiconductor channel including a second layer formed along a sidewall of the second trench, the second layer including one of a group III-V material layer and a group IV material layer; wherein both channels are used in a CMOS transistor device and the first and second layers are epitaxial (EPI). In an embodiment the first layer has an opposite polarity of the second layer. An embodiment comprises: a substrate upon which the interlayer dielectric is formed; wherein the first layer has a first lattice constant, the second layer has a second lattice constant, and the substrate has a third lattice constant different from at least one of the first and second lattice constants. In an embodiment the first and second trenches are formed on and directly over fins. An embodiment comprises: a third layer formed along another sidewall of the first trench, the third layer including one of a group III-V material layer and a group IV material layer; a fourth layer formed along another sidewall of the second trench, the fourth layer including one of a group III-V material layer and a group IV material layer; wherein the first and third layers are generally equidistant from the first trench and the second and fourth layers are generally equidistant from the second trench. In an embodiment the first layer includes the group III-V material layer; and the second layer includes the group IV material layer.

An embodiment comprises: a fin structure including a first lattice constant and a fin top and opposing fin sidewall portions extending from the fin top towards a substrate; an epitaxial (EPI) layer, including a second lattice constant different than the first lattice constant, comprising opposing EPI sidewall portions respectively directly contacting the opposing fin sidewall portions; wherein (a) the EPI layer comprises one of a IV and a III-V material, (b) the fin structure includes silicon, and (c) the EPI layer is included in a channel of a transistor. In an embodiment the fin includes a concentration of strain adjacent the fin top and the EPI layer lacks defects along the entire border between the EPI layer and the fin structure.

An embodiment comprises: an interlayer dielectric on a substrate and including a trench formed on and directly over one of an additional trench and a fin; and an epitaxial (EPI) layer, formed along a sidewall of the trench, including one of a group IV material and a group III-V material; wherein the EPI layer and the substrate have different lattice constants. In an embodiment the EPI layer comprises a group III-V material. In an embodiment the trench is formed on and directly over the fin. In an embodiment the EPI layer is included entirely between the sidewall of the trench and a sidewall of the one of the additional trench and the fin. In an embodiment an additional EPI layer, formed along an additional sidewall of the trench, including another one of a group IV material and a group III-V material; wherein the additional EPI layer and the substrate have different lattice constants. In an embodiment the EPI layer and the additional EPI layer are generally equidistant from the trench.

An embodiment includes an apparatus comprising: a first trench structure including opposing first sidewall portions extending towards a substrate; a bridge layer including a bridge layer sidewall portion formed on one of the first sidewall portions; a second trench structure including opposing second sidewall portions extending towards the substrate; and an EPI layer including an EPI layer sidewall portion respectively formed on one of the second sidewall portions; wherein the bridge layer sidewall portion is included in a first transistor channel. In an embodiment the EPI layer sidewall portion is included in a second transistor channel that has an opposite polarity of the first transistor channel. In an embodiment the EPI layer sidewall portion is included in a second transistor channel and the bridge layer has an opposite polarity of the EPI layer. In an embodiment the EPI layer and the bridge layer have unequal lattice constants. In an embodiment the first and second trench structures each couple to a silicon fin. In an embodiment the bridge layer includes an additional bridge layer sidewall portion formed on one of the first sidewall portions; the EPI layer includes an additional EPI layer sidewall portion formed on one of the second sidewall portions; and the first sidewall portions are equidistant from the first trench structure and the second sidewall portions are equidistant from the second trench structure.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   a fin structure including a fin top and opposing fin sidewall portions extending from the fin top towards a substrate;
   a bridge layer including opposing bridge layer sidewall portions respectively directly contacting the opposing fin sidewall portions; and
   an epitaxial (EPI) layer comprising opposing EPI sidewall portions respectively directly contacting the opposing bridge layer sidewall portions;
   wherein a lattice constant differential between the bridge layer and fin structure is less than a lattice constant differential between the bridge layer and the EPI layer
   wherein a single plane, orthogonal to a long vertical axis of the fin structure, intersects the fin structure over a first area and the EPI sidewalls over a second area and the second area is greater than the first area.

2. The apparatus of claim 1 wherein the EPI layer comprises an EPI material including one of a group IV material and a group III-V material, the fin structure includes a fin structure material including silicon, and the bridge layer includes a bridge layer material unequal to either of the fin structure material and the EPI material.

3. The apparatus of claim 2 wherein the EPI layer is included in a channel of a transistor and couples to a source and a drain of the transistor.

4. The apparatus of claim 3 wherein the substrate does not include a silicon on insulator (SOI) configuration.

5. The apparatus of claim 2 wherein the EPI layer is included in a channel of a transistor and couples to a source and a drain of the transistor, the source and drain both directly contacting the fin structure.

6. The apparatus of claim 2 wherein the fin structure includes a concentration of strain adjacent the fin top.

7. The apparatus of claim 2 wherein the EPI layer lacks defects along the entire border between the EPI layer and the bridge layer.

8. The apparatus of claim 1 wherein the fin structure is monolithic with the substrate and the EPI layer sidewall portions are monolithic with one another.

9. The apparatus of claim 1 wherein the bridge sidewall layers are equidistant from the fin structure.

10. An apparatus comprising:
    a fin structure including a fin top and opposing fin sidewall portions extending from the fin top towards a substrate;
    a bridge layer including opposing bridge layer sidewall portions respectively directly contacting the opposing fin sidewall portions; and
    an epitaxial (EPI) layer comprising opposing EPI sidewall portions respectively directly contacting the opposing bridge layer sidewall portions;
    wherein a lattice constant differential between the bridge layer and fin structure is less than a lattice constant differential between the bridge layer and the EPI layer:
    wherein the EPI layer lacks defects along the entire border between the EPI layer and the bridge layer.

11. The apparatus of claim 10 wherein the EPI layer comprises an EPI material including one of a group IV material and a group III-V material, the fin structure includes a fin structure material including silicon, and the bridge layer includes a bridge layer material unequal to either of the fin structure material and the EPI material.

12. The apparatus of claim 11 wherein the EPI layer is included in a channel of a transistor and couples to a source and a drain of the transistor.

13. The apparatus of claim 11 wherein the EPI layer is included in a channel of a transistor and couples to a source and a drain of the transistor, the source and drain both directly contacting the fin structure.

14. The apparatus of claim 11 wherein the fin structure includes a concentration of strain adjacent the fin top.

15. The apparatus of claim 10 wherein a single plane, orthogonal to a long vertical axis of the fin structure, intersects the fin structure over a first area and the EPI sidewalls over a second area and the second area is greater than the first area.

16. The apparatus of claim 10 wherein the fin structure is monolithic with the substrate and the EPI layer sidewall portions are monolithic with one another.

17. The apparatus of claim 10 wherein the bridge sidewall layers are equidistant from the fin structure.

18. An apparatus comprising:
   a fin structure including a fin top and opposing fin sidewall portions extending from the fin top towards a substrate;
   an epitaxial (EPI) layer comprising opposing EPI sidewall portions respectively directly adjacent the opposing fin layer sidewall portions; and
   a bridge layer including opposing bridge layer sidewall portions respectively directly contacting the opposing fin sidewall portions;
   wherein the EPI sidewall layers are equidistant from the fin structure;
   wherein a single plane, orthogonal to a long vertical axis of the fin structure, intersects the fin structure over a first area and the EPI sidewalls over a second area and the second area is greater than the first area;
   wherein a lattice constant differential between the bridge layer and fin structure is less than a lattice constant differential between the bridge layer and the EPI layer.

19. The apparatus of claim 18, wherein the EPI layer comprises an EPI material including one of a group IV material and a group III-V material, the fin structure includes a fin structure material including silicon, and the bridge layer includes a bridge layer material unequal to either of the fin structure material and the EPI material.

20. The apparatus of claim 18 wherein there is no lattice mismatch between the fin structure and the bridge layer.

21. The apparatus of claim 18:
   wherein the bridge layer includes at least two bridge materials having respective concentrations to one another of x and 1-x;
   wherein the fin structure includes at least two fin materials having respective concentrations to one another of y and 1-y, wherein x is unequal to y;
   wherein the at least two bridge materials include the same atomic elements as the at least two fin materials.

22. The apparatus of claim 18, wherein the fin structure includes $Si_xGe_{1-x}$ and the bridge layer include $Si_yGe_{1-y}$ and x is unequal to y.

23. The apparatus of claim 18, wherein the EPI layer is included in a channel of a transistor and couples to a source and a drain of the transistor.

24. The apparatus of claim 18 wherein the EPI layer lacks defects along the entire border between the EPI layer and the bridge layer.

25. The apparatus of claim 18, wherein the substrate does not include a silicon on insulator (SOI) configuration.

* * * * *